United States Patent
He et al.

(10) Patent No.: US 10,319,811 B2
(45) Date of Patent: Jun. 11, 2019

(54) SEMICONDUCTOR DEVICE INCLUDING FIN HAVING CONDENSED CHANNEL REGION

(71) Applicant: International Business Machines Corporation, Armonk, NY (US)

(72) Inventors: Hong He, Schenectady, NY (US); Effendi Leobandung, Stormville, NY (US); Gen Tsutsui, Albany, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/949,977

(22) Filed: Nov. 24, 2015

(65) Prior Publication Data
US 2017/0033219 A1    Feb. 2, 2017

Related U.S. Application Data

(63) Continuation of application No. 14/809,688, filed on Jul. 27, 2015, now abandoned.

(51) Int. Cl.
| | |
|---|---|
| *H01L 29/78* | (2006.01) |
| *H01L 29/06* | (2006.01) |
| *H01L 29/165* | (2006.01) |
| *H01L 29/66* | (2006.01) |
| *H01L 21/311* | (2006.01) |

(Continued)

(52) U.S. Cl.
CPC ........ *H01L 29/0649* (2013.01); *H01L 21/283* (2013.01); *H01L 21/31116* (2013.01); *H01L 29/1054* (2013.01); *H01L 29/161* (2013.01); *H01L 29/66545* (2013.01);
(Continued)

(58) Field of Classification Search
CPC ...................................................... H01L 29/78
See application file for complete search history.

(56) References Cited

U.S. PATENT DOCUMENTS

| | | | |
|---|---|---|---|
| 2008/0001171 A1* | 1/2008 | Tezuka | ............ H01L 21/823807 257/191 |
| 2013/0196478 A1* | 8/2013 | Chang | ................. H01L 29/7853 438/283 |

(Continued)

OTHER PUBLICATIONS

He et al., "Semiconductor Device Including Fin Having Condensed Channel Region", U.S. Appl. No. 14/809,688, filed Jul. 27, 2015.
(Continued)

*Primary Examiner* — Joseph C. Nicely
*Assistant Examiner* — Lamont B Koo
(74) *Attorney, Agent, or Firm* — Cantor Colburn LLP; Vazken Alexanian

(57) ABSTRACT

A finFET semiconductor device includes at least one semiconductor fin on an upper surface of a substrate. The semiconductor fin includes a channel region interposed between opposing source/drain regions. A gate stack is on the upper surface of the substrate and wraps around sidewalls and an upper surface of only the channel region. The channel region further includes a condensed portion formed of a first semiconductor material and a second semiconductor material. The source/drain regions are formed of the first semiconductor material while excluding the second semiconductor material.

16 Claims, 12 Drawing Sheets

(51) Int. Cl.
*H01L 21/283* (2006.01)
*H01L 29/161* (2006.01)
*H01L 29/10* (2006.01)

(52) U.S. Cl.
CPC ...... *H01L 29/66795* (2013.01); *H01L 29/785* (2013.01); *H01L 29/7848* (2013.01); *H01L 2029/7858* (2013.01)

(56) References Cited

U.S. PATENT DOCUMENTS

| | | | |
|---|---|---|---|
| 2014/0054705 A1* | 2/2014 | Basker | H01L 29/66545 257/349 |
| 2015/0162445 A1* | 6/2015 | Wu | H01L 29/7848 257/344 |

OTHER PUBLICATIONS

List of IBM Patents or Patent Applications Treated as Related; (Appendix P), Filed Feb. 8, 2016; 2 pages.

* cited by examiner

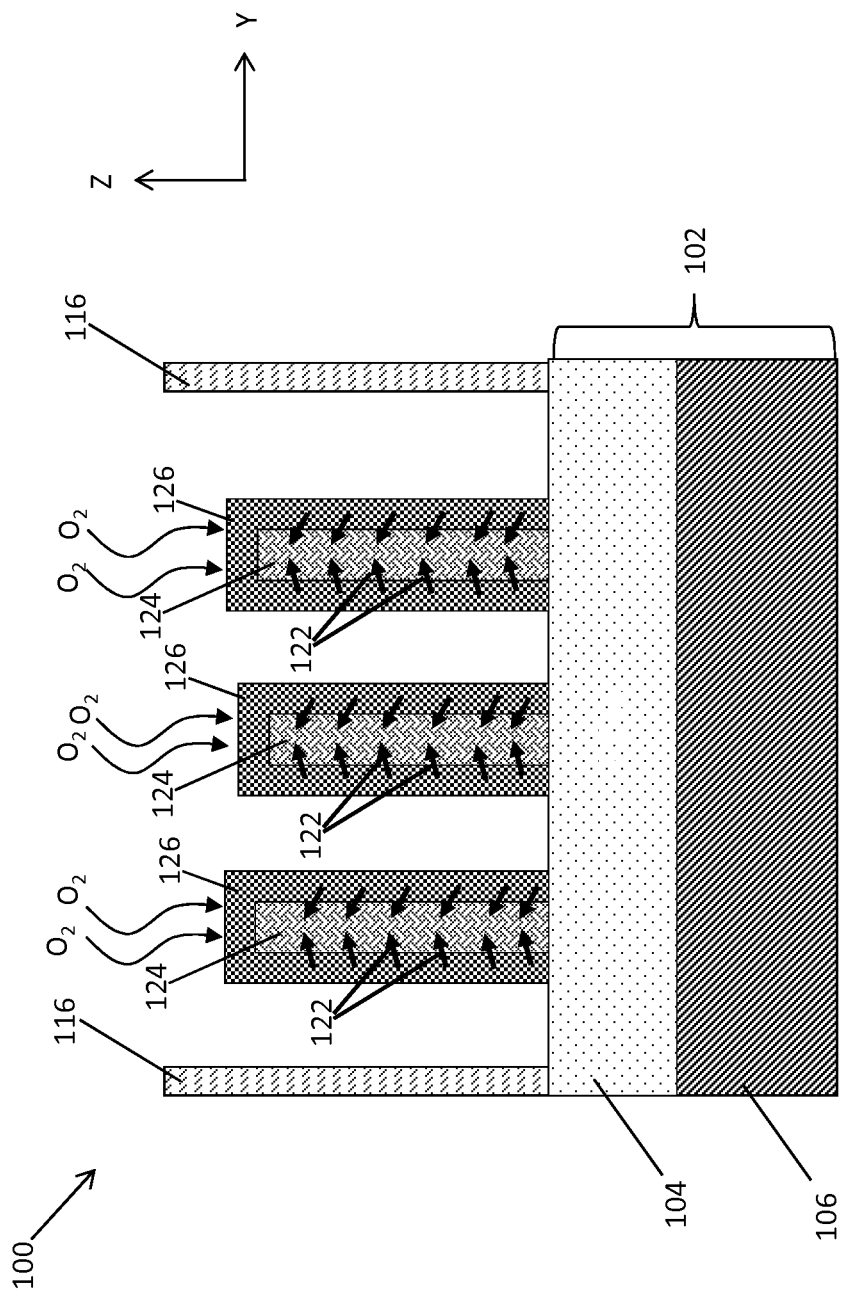

SEMICONDUCTOR DEVICE INCLUDING FIN HAVING CONDENSED CHANNEL REGION

DOMESTIC PRIORITY

This application is a continuation of U.S. patent application Ser. No. 14/809,688, filed Jul. 27, 2015, the disclosure of which is incorporated by reference herein in its entirety.

BACKGROUND

The present invention relates to semiconductor devices, and more specifically, to fin-type field effect transistor (finFET) devices.

Recent semiconductor fabrication methods have been developed to replace pure silicon (Si) fins with silicon germanium (SiGe) fins, especially in p-type finFET devices. Forming the fins from SiGe reduces the threshold voltage (Vt) of the semiconductor device, thereby increasing the drive current that flows through the channel. Further, SiGe material provides higher carrier mobility than Si. Accordingly, SiGe fins may have improve hole mobility performance with respect to Si fins. Conventional methods use an ion implantation process that drives Ge ions into the fin to form a SiGe fin. However, these conventional ion implantation methods may damage the fin and reduce overall performance of the finFET device.

SUMMARY

According to a non-limiting embodiment, a finFET semiconductor device includes at least one semiconductor fin on an upper surface of a substrate. The semiconductor fin includes a channel region interposed between opposing source/drain regions. A gate stack is on the upper surface of the substrate and wraps around sidewalls and an upper surface of only the channel region. The channel region further includes a condensed portion formed of a first semiconductor material and a second semiconductor material. Unlike the channel region, the source/drain regions are formed of the first semiconductor material while excluding the second semiconductor material.

According to another non-limiting embodiment, a method of fabricating a finFET device comprises forming, on an upper surface of a semiconductor substrate, at least one semiconductor fin comprising a first semiconductor material. The at least one semiconductor fin has a channel region interposed between opposing source/drain regions. The method further includes forming a flowable insulator layer on the source/drain regions, and forming a dummy gate stack on the channel region. The method further includes selectively removing the dummy gate stack with respect to the flowable insulator layer to expose the channel region. The method further includes performing a condensation process to selectively transform the exposed channel region into a second semiconductor material different from the first semiconductor material so as to increase carrier mobility conductivity of the channel region, while maintaining the first semiconductor material of the source/drain regions.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings in which:

FIG. 4B illustrates the semiconductor device of FIG. 4A in the second orientation;

DETAILED DESCRIPTION

The transistor gain of semiconductor devices such as finFET devices, for example, is proportional to the mobility of the majority carrier traveling through the channel region. The current carrying capability, and therefore the performance of a finFET device is proportional to the mobility of the majority carrier in the channel. Traditional finFET devices include one or more semiconductor fins formed of silicon (Si). However, studies of semiconductor materials have shown that silicon germanium (SiGe) provides increased hole mobility, which are the majority carriers in a P-channel field effect transistor (i.e., PFET devices). Various non-limiting embodiments of the invention provide a finFET device including one or more fins having a SiGe condensed channel region. In this manner, hole mobility through the channel region of the fin is improved so as to enhance the overall performance of the finFET device.

Figure 1A:
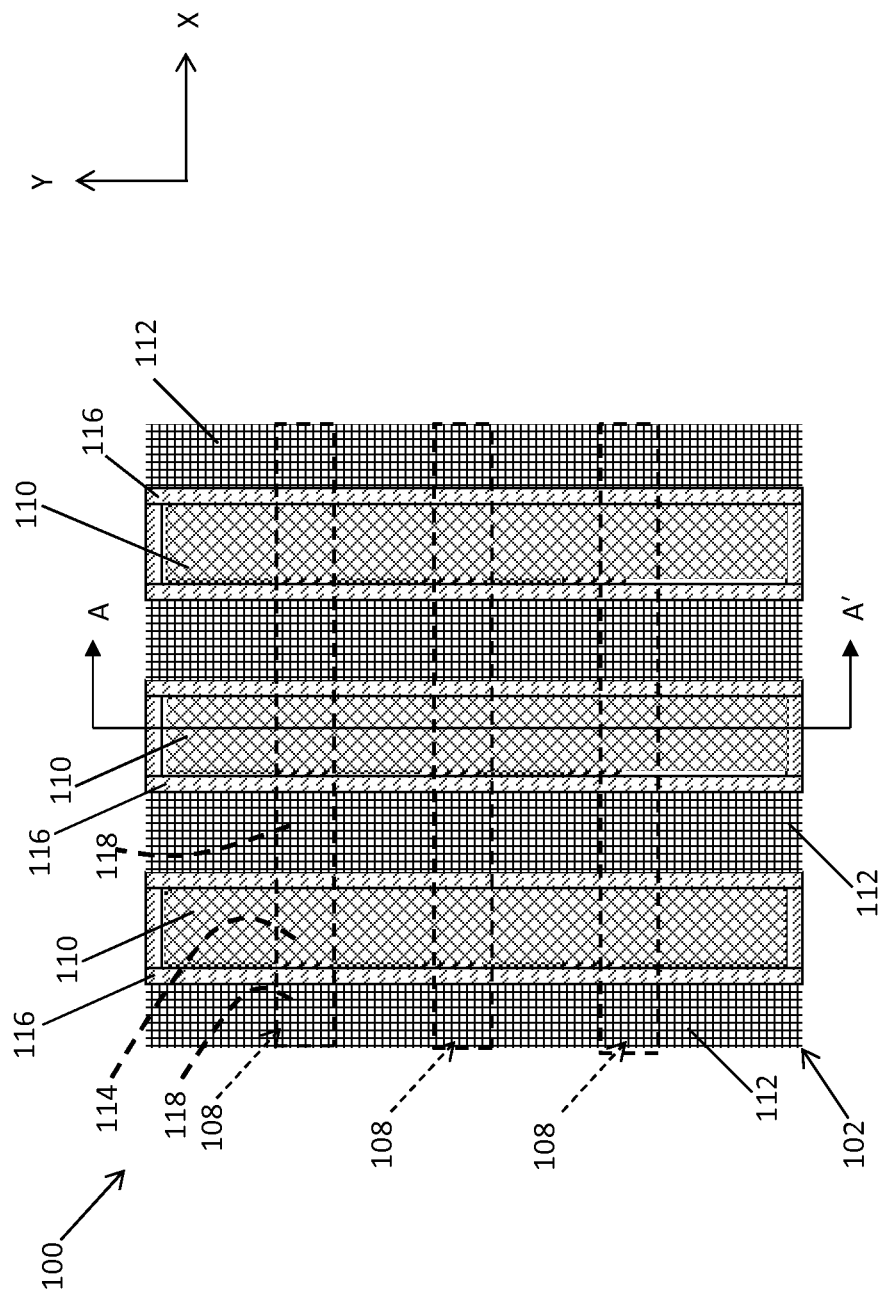
FIG. 1A illustrates an intermediate semiconductor device in a first orientation including a plurality of semiconductor fins including source/drain regions covered by a flowable insulator material and a channel region covered by a dummy gate stack according to a non-limiting embodiment.
Figure 1B:
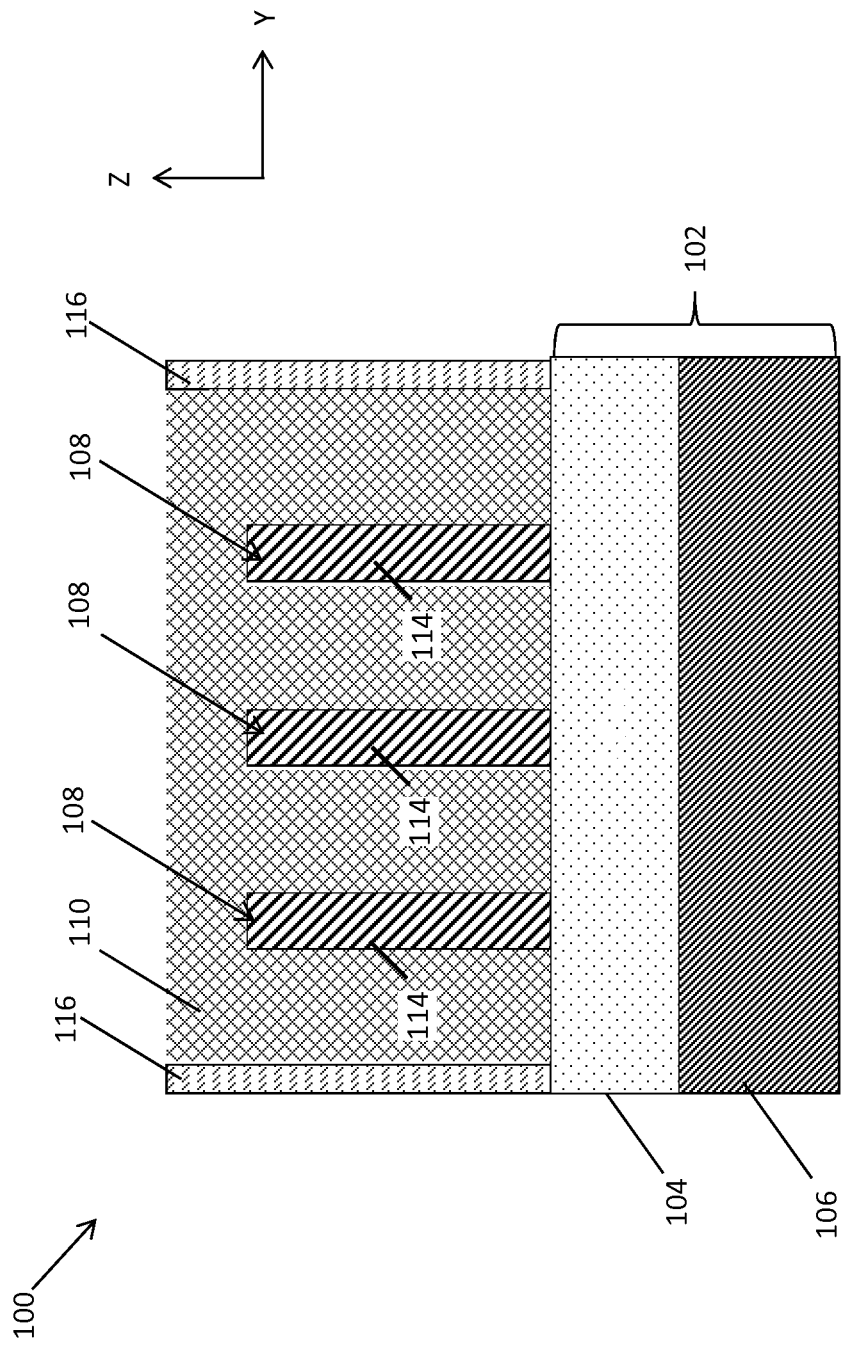
FIG. 1B illustrates the semiconductor device according to a second orientation.

With reference now to FIGS. 1A-1B, a semiconductor structure 100 which serves as a starting point for fabricating a finFET device in accordance with an exemplary embodiment is shown. The semiconductor structure 100 includes a semiconductor substrate 102 extending along a first axis (e.g., X-axis) to define a length, a second axis (e.g., Y axis) to define a width, and a third axis (Z-axis) to define a height. The substrate 102 is formed as a semiconductor-on-insulator (SOI) substrate, for example, including a buried insulator layer 104 (FIG. 1B) formed on an upper surface of a bulk substrate layer 106. The buried insulator layer 104 is formed of, for example, silicon dioxide ($SiO_2$) and the bulk substrate layer 106 is formed, for example, of silicon (Si). The buried insulator layer 104 has a vertical thickness (e.g., height) ranging from, for example, approximately 0.5 nanometers to approximately 200 nm. An active semiconductor layer (not shown) formed atop the buried insulator layer 104 is patterned to form one or more semiconductor fins 108, as further illustrated in FIG. 1B. According to a non-limiting embodiment, the semiconductor fins 108 are initially formed of silicon (Si). Various fin fabrications can be used to form the semiconductor fins 108 such as, for example, a sidewall image transfer (SIT) process. The semiconductor fins 108 extend along the X-axis to define a fin length, the Y-axis to define a fin width, and the Z-axis to define a fin height. The fin width ranges from approximately 3 nm to approximately 10 nm, the fin length ranges from approximately 50 nm to approximately 2000 nm, and the fin height ranges from ranges from approximately 20 nm to approximately 60 nm.

As further illustrated in FIGS. 1A-1B, the semiconductor fins 108 are covered by one or more dummy gate stacks 110 and a flowable insulator layer 112 (FIG. 1A). The dummy gate stacks 110 are formed on an upper surface of the buried insulator layer 104 and wrap around the channel region 114 of the semiconductor fins 108. According to at least one embodiment, the dummy gate stacks 110 are formed, for example, of an amorphous or polysilicon material. The dummy gate stacks 110 extend along the Y-axis to define a gate width, the X-axis to define a gate length, and the Z-axis to define a gate height. The gate width ranges from approximately 50 nm to approximately 2000 nm, the gate length ranges from approximately 15 nm to approximately 500 nm, and the gate height ranges from approximately 50 nm to approximately 150 nm. Although not illustrated, the dummy gate stack 110 may further include a gate oxide layer (not shown). The gate oxide layer is interposed between the dummy gate stack 110 and the fin 108. The gate oxide layer may be formed as a dummy gate oxide layer, with the intention of being replaced by a high-k gate oxide layer or metal gate layer as understood by one of ordinary skill in the art. In addition, gate spacers 116 are formed on sidewalls of each dummy gate stack 110. In this manner, the gate spacers 116 are interposed between the dummy gate stacks 110 and the flowable insulator layer 112. The gate spacers 116 are formed from, for example, silicon nitride (SiN).

The flowable insulator layer 112 is formed atop the buried insulator layer 104 and covers the source/drain (S/D) regions 118 of the semiconductor fins 108. The flowable insulator layer 112 is formed, for example, of $SiO_2$. The flowable insulator layer 112 has a vertical thickness (e.g., height) ranging from approximately 50 nm to approximately 150 nm. Although not illustrated, it should be appreciated that an epitaxially grown semiconductor layer formed of Si, for example, may be grown from sidewalls and upper surfaces of the S/D regions 118 of the semiconductor fins 108 prior to forming the flowable insulator layer 112. The epitaxially grown semiconductor layer is configured to merge the S/D regions 118 of each semiconductor fin 108 as understood by one of ordinary skill in the art.

Figure 2A:
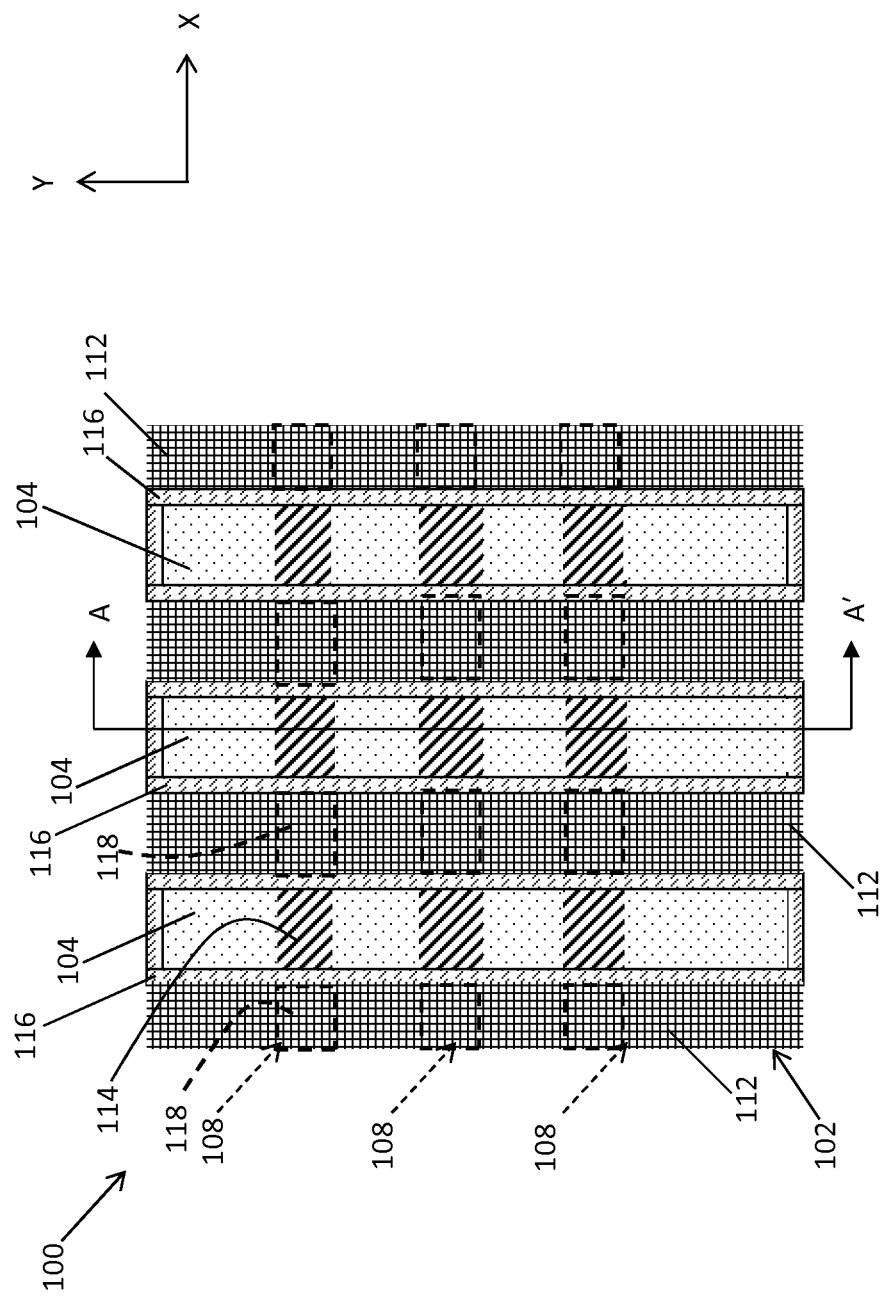
FIG. 2A illustrates the semiconductor device of FIGS. 1A-1B in the first orientation following removal of the dummy gate stack to expose the channel regions of the fins.
Figure 2B:
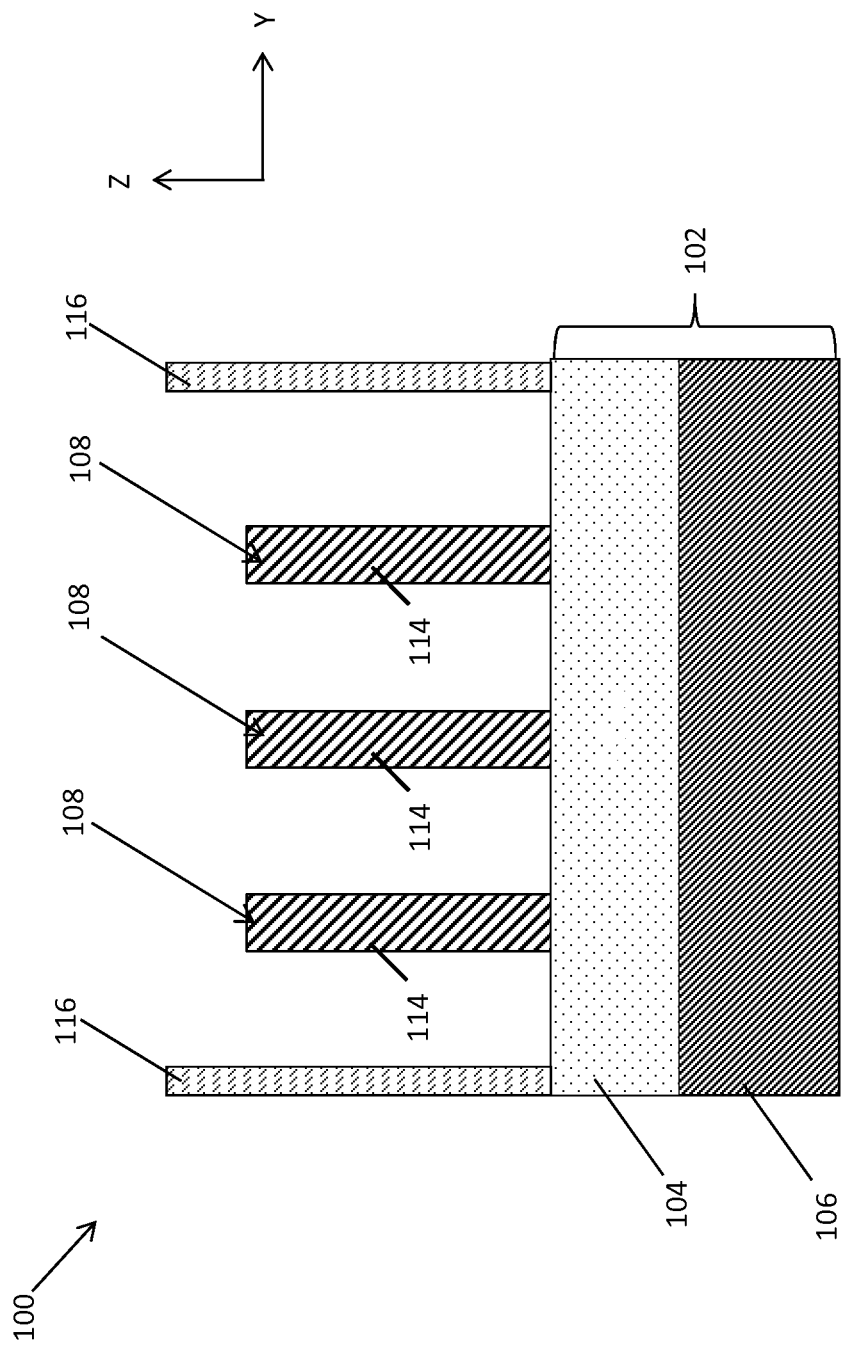
FIG. 2B illustrates the semiconductor device of FIG. 2A in the second orientation.

Turning to FIGS. 2A-2B, the semiconductor device 100 is illustrated following removal of the dummy gate stack 110. Removal of the dummy gate stack 110 exposes the channel portion 114 of the semiconductor fins 108 and the underlying buried insulator layer 104. The dummy gate stack 110 may be removed (i.e., pulled) using various etching processes such as, an ammonium hydroxide etching process, for example, which is implemented in well-known replacement metal gate fabrication processes. Since source/drain regions 118 are covered by the gate spacers 116 and flowable insulator layer 112, no additional masking layers are necessary to remove the dummy gate stack 110.

Figure 3A:
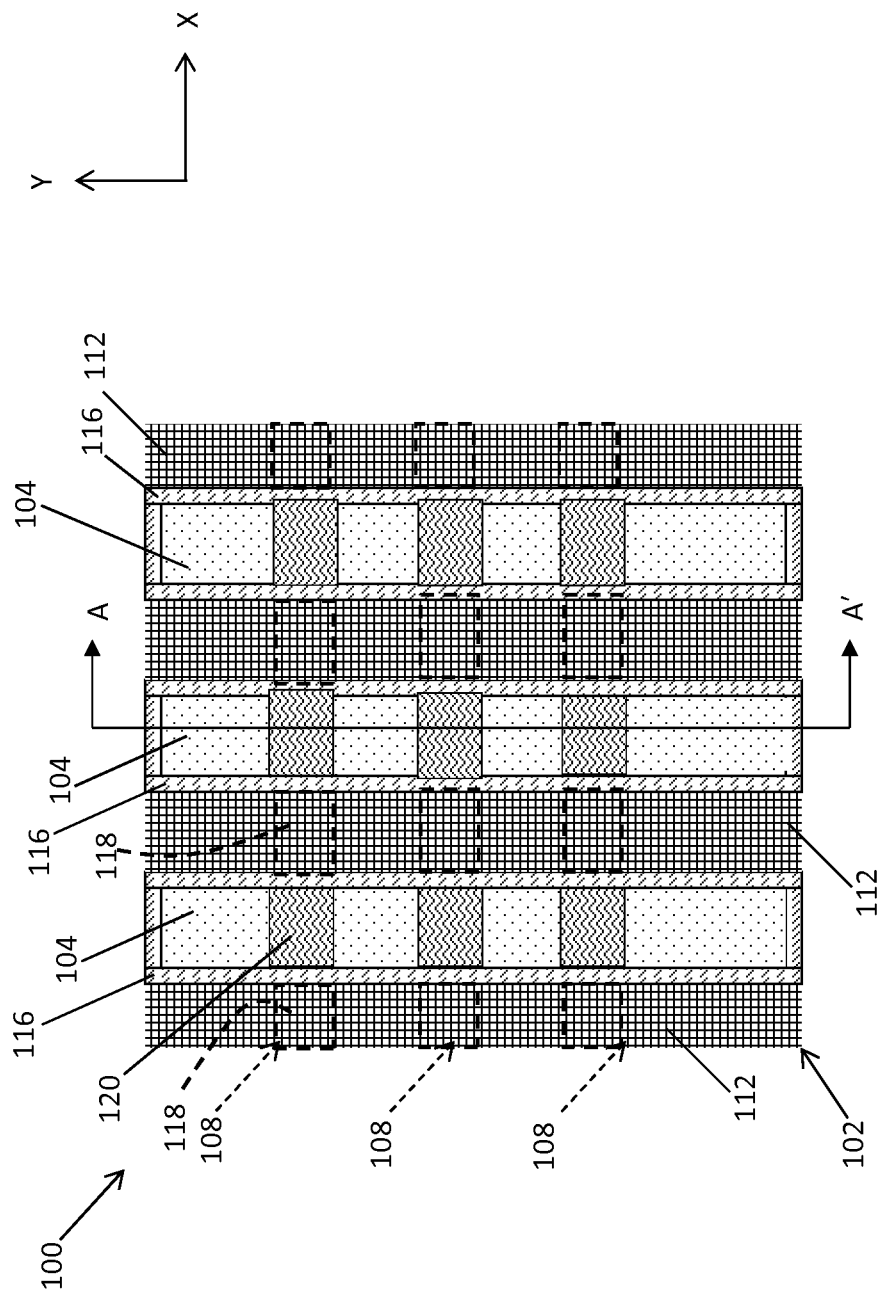
FIG. 3A illustrates the semiconductor device of FIGS. 2A-2B in the first orientation after growing a condenser layer on the sidewalls and an upper surface of the channel regions.
Figure 3B:
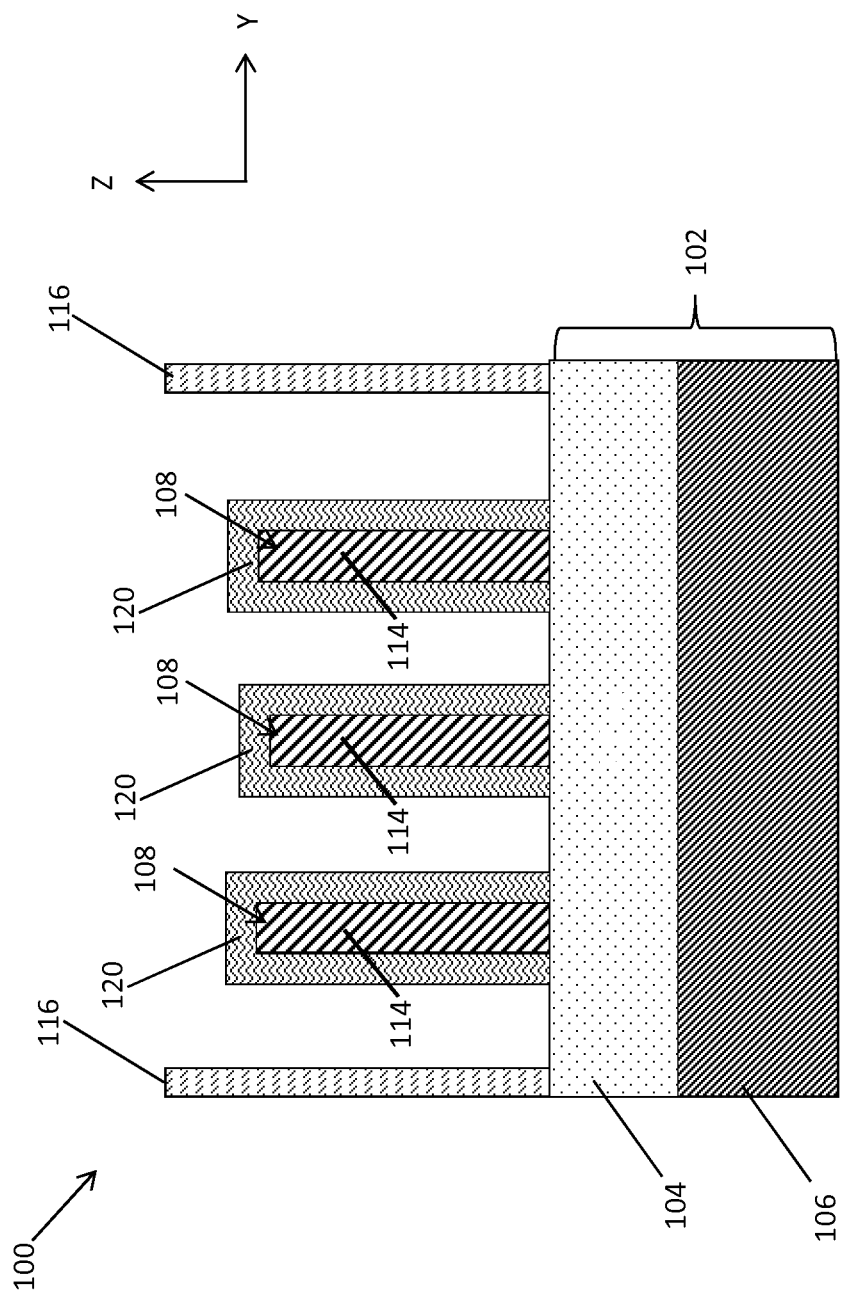
FIG. 3B illustrates the semiconductor device of FIG. 3A in the second orientation.

Referring now to FIGS. 3A-3B, a condenser layer 120 is epitaxially deposited on sidewalls and an upper surface of the channel region 114. According to an embodiment, the condenser layer 120 is formed using an epitaxial deposition process to ensure sufficient contact between the condenser and the surfaces of the fins 108. The epitaxial growth process is selective to semiconductor materials such as, for example, silicon (Si). In this manner, the condenser layer 120 grows readily on the exposed semiconductor (e.g., Si) material of the channel region 114, while avoiding growth on the exposed buried insulator layer 104. According to a non-limiting embodiment, the condenser layer has a thickness ranging from approximately 1 nm to approximately 5 nm.

The condenser layer 120 may include a donor material (not shown in FIGS. 3A-3B) which, when driven into the semiconductor material of fins 108, increases carrier mobility through the channel regions 114 without increasing or substantially increasing the dimensions of the fins 108. According to a non-limiting embodiment, the donor material includes germanium (Ge) whereby a SiGe condenser layer 120 is epitaxially grown on the sidewalls and upper surface of the channel region 114. The concentration of Ge donor material included in the condenser layer 120 ranges, for example, from approximately 50 to approximately 90. Since source/drain regions 118 are covered by the gate spacers 116 and flowable insulator layer 112, no additional masking layers are necessary to protect the source/drain regions 118 when epitaxially growing the condenser layer 120 on the channel regions 114 of the fins 108.

Figure 4A:
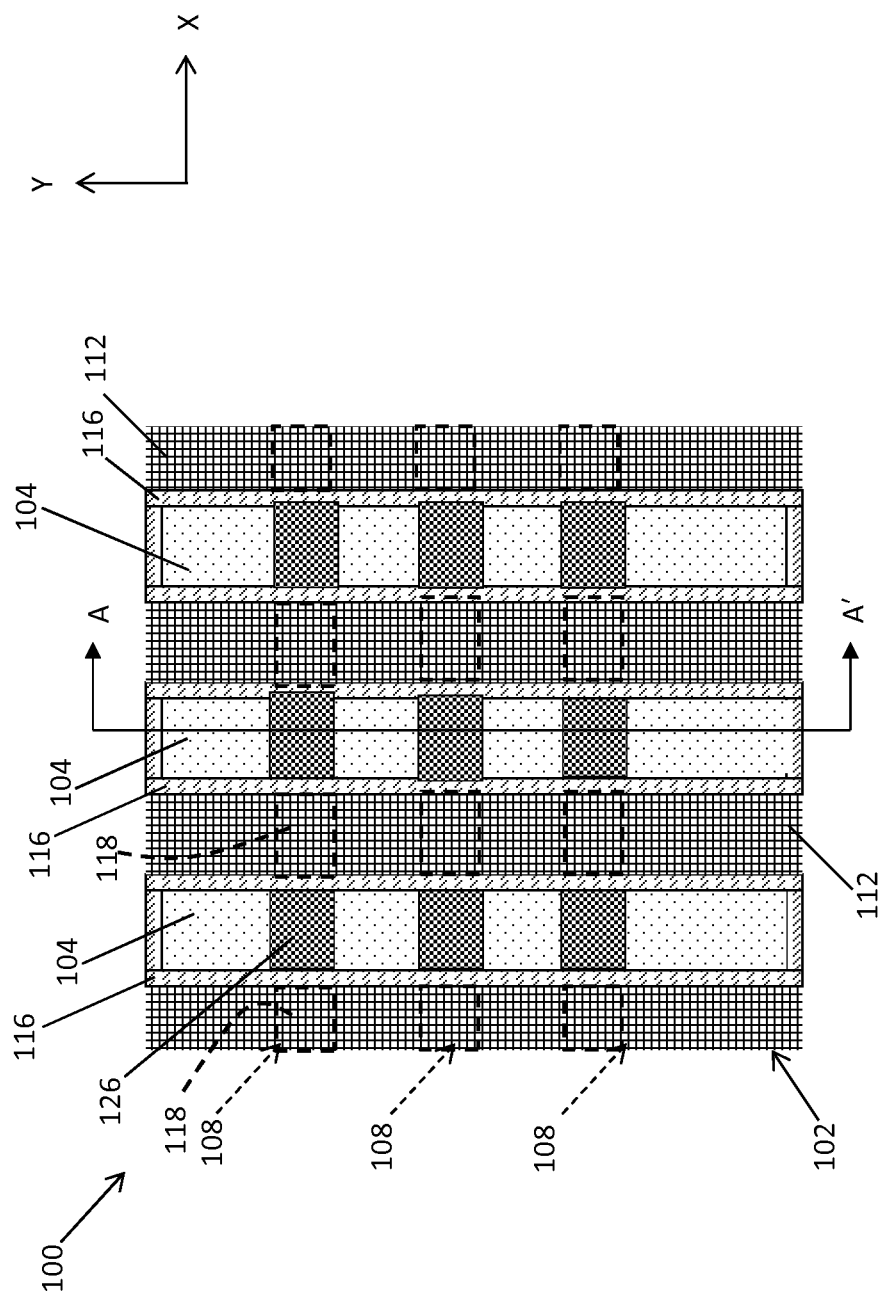
FIG. 4A illustrates the semiconductor device of FIGS. 3A-3B in the first orientation undergoing a condensation processes so as to drive a donor material into the channel regions and oxidize the condenser layer.

Turning to FIGS. 4A-4B, a condensation process is performed to drive or push donor material from the condenser layer 120 into the channel region 114 of the fins 108. According to a non-limiting embodiment, the condensation process includes exposing the channel region 114 to ions capable of condensing the channel region 114 into a second semiconductor material different from the initial semiconductor layer of the fins (e.g., Si). For example, the exposed channel region 114 is exposed to oxygen ($O_2$) ions, for example, at a temperature of approximately 600 degrees Celsius for a time period of approximately 15 minutes. In this manner, the condenser layer 120 is oxidized and the released donor material 122 is driven into the channel region 114 so as to condense the channel region 114, i.e., chemically transform the first semiconductor material into the second semiconductor material.

According to at least one embodiment, if the condenser layer 120 is formed of SiGe, and the fins 108 are formed of Si, then Ge donor material 122 is released from the condenser layer 120 and driven into the channel region 114 during the condensation process. As a result, the composition of the fins 108 is altered as the donor material 122 is diffused into the first semiconductor material (e.g., Si) of the exposed channel region 114. In this manner the fin channel regions 114 are condensed, i.e., chemically transformed, into a condensed channel region 124 such as, for example, a SiGe channel region 124. According to a non-limiting embodiment, the concentration of Ge contained in the condensed channel region 124 is greater than 50% of the Si contained in the condensed channel region. Condensing the channel regions of the fins may also induce a strain in the fins. In the case where the channel region 124 is formed of SiGe, for example, the condensation process may induce a compressive strain in the SiGe. The S/D regions 118 are not condensed and remain comprising their initial semiconductor material (e.g., Si) since they are covered by the flowable insulator layer 112. In the case where the channel regions 124 are formed from SiGe, for example, maintaining the S/D regions 118 as Si achieves a bandgap offset between Si and SiGe, thereby increasing carrier velocity which increases current and overall device performance. Following the oxidation process, the condenser layer 120 in chemically transformed into an oxidized layer 126 as further illustrated in FIGS. 4A-4B. If the condenser layer 120 is formed of SiGe, then the resulting oxidized layer 126 is formed, for example, of $SiO_2$.

Figure 5A:
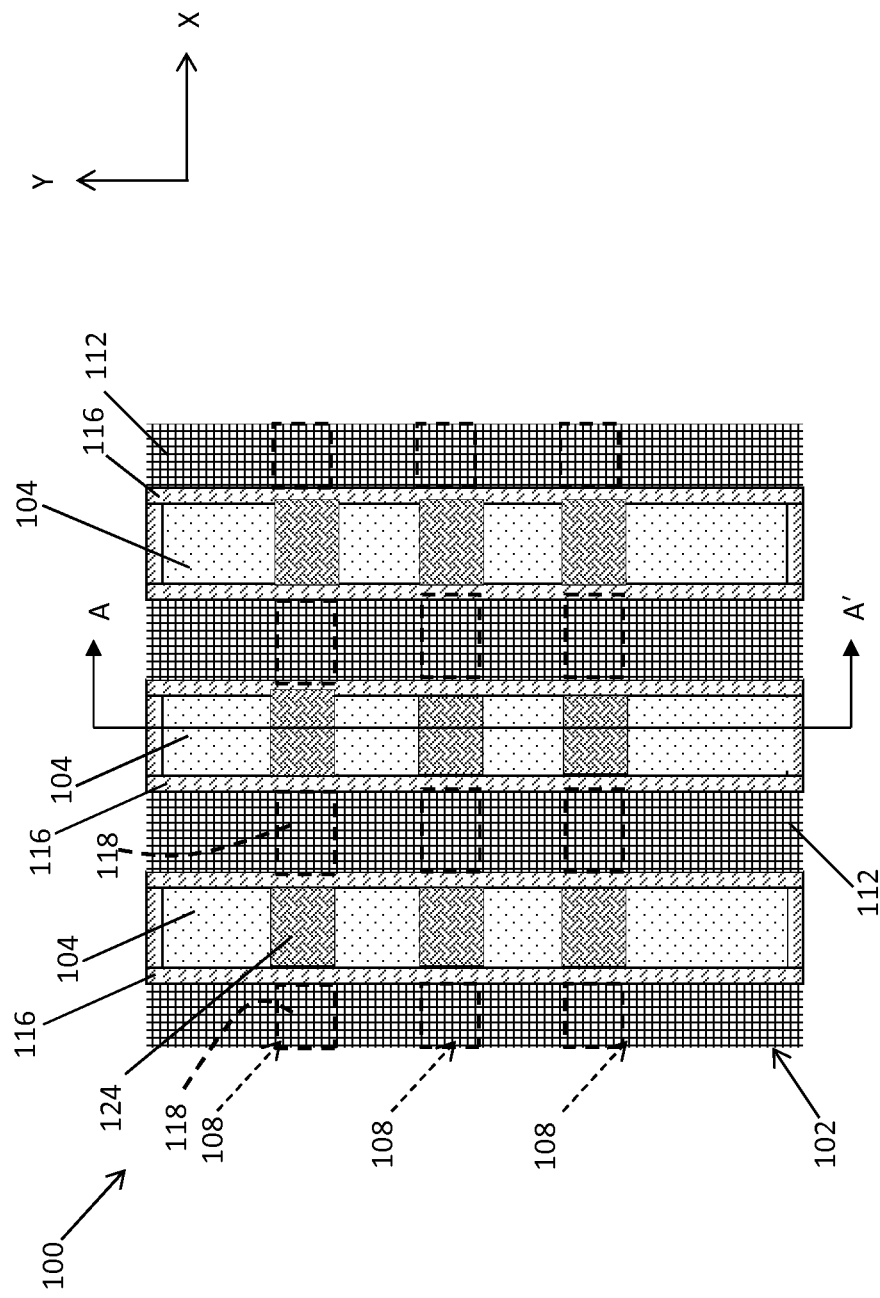
FIG. 5A illustrates the semiconductor device of FIGS. 4A-4B in the first orientation after selectively removing the oxidized condenser layer from the condensed channel regions of the fins.
Figure 5B:
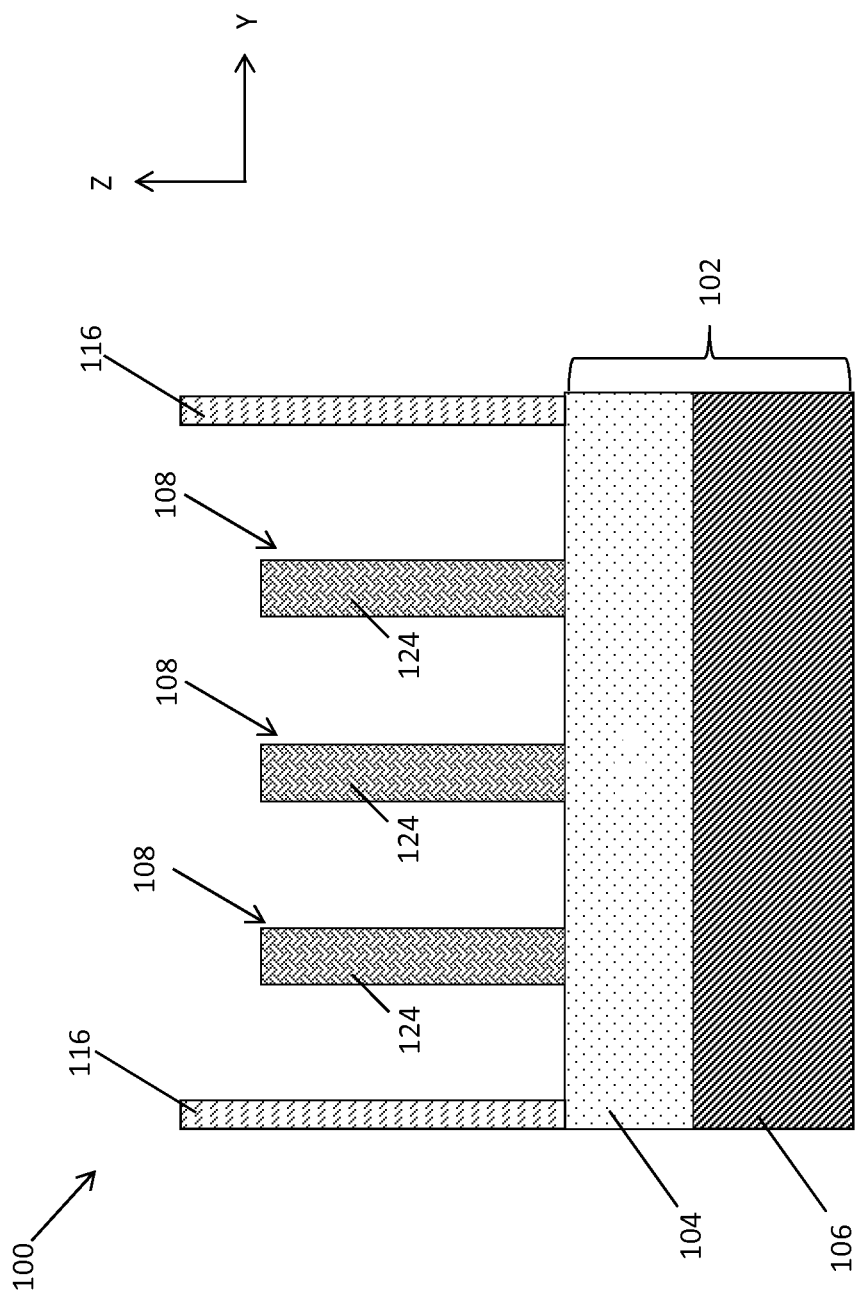
FIG. 5B illustrates the semiconductor device of FIG. 5A in the second orientation.

Referring now to FIGS. 5A-5B, the semiconductor device 100 is illustrated following removal of the oxidized layer (previously identified as numeral 126) from the surfaces of the condensed channel region 124. According to a non-limiting embodiment, a reactive ion etching (RIE) process selective to the gate spacer material (e.g., SiN) and the condensed fin material (SiGe) is performed to selectively remove the oxidized layer. The flowable insulator layer 112 is formed with a thickness so as to serve as a buffer when removing the oxidized layer. Accordingly, a portion of the flowable insulator layer 112 is permitted to be etched while still adequately protecting the S/D regions 118. According to a non-limiting embodiment, the thickness of oxidized layer 126 is limited to around 10 nm, for example. In this manner, S/D channel shorting between the buried insulator layer 104 and the S/D regions 118 may be prevented even if a portion of the buried insulator layer 104 is recessed when etching away the oxidized layers 126 from the fins 108.

Figure 6A:
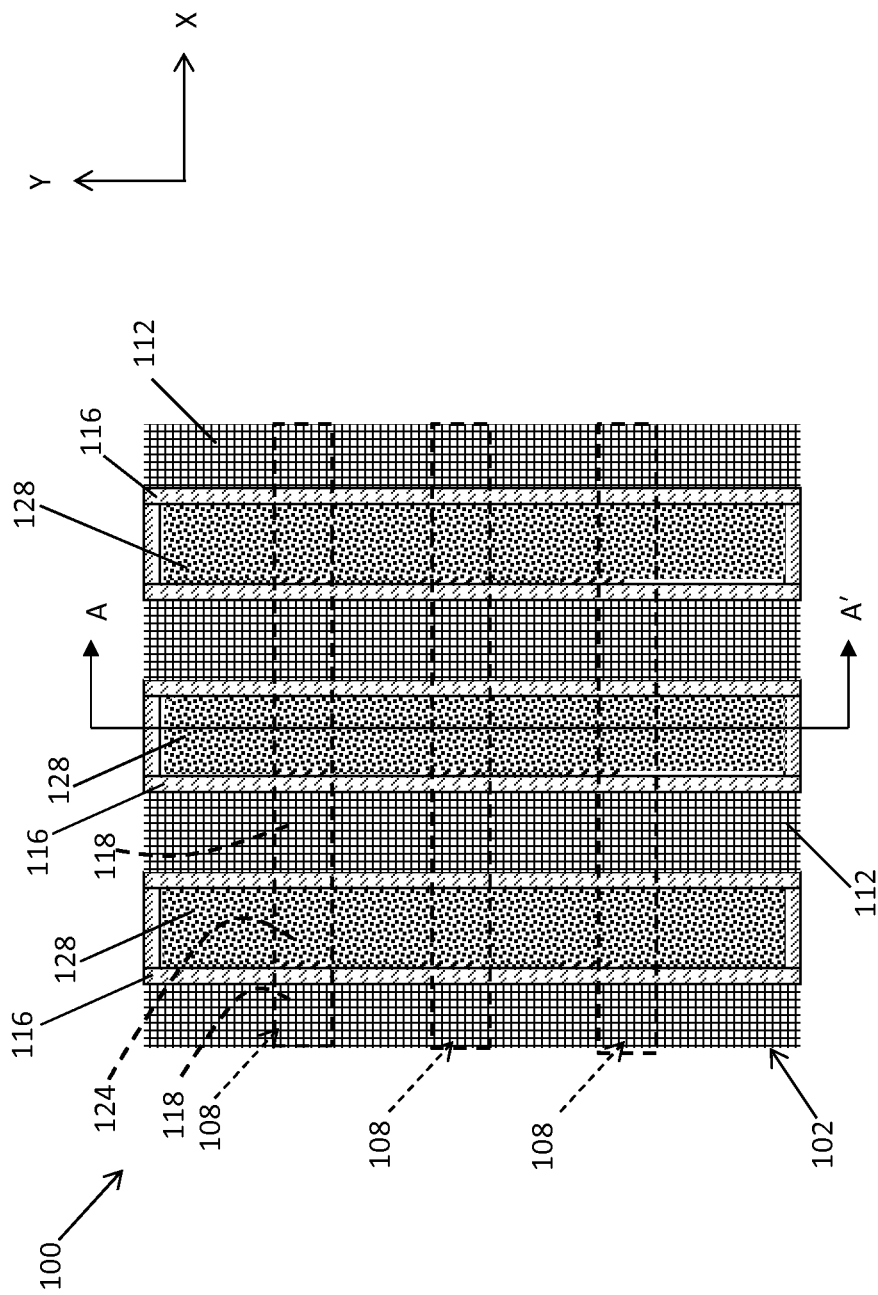
FIG. 6A illustrates the semiconductor device of FIGS. 5A-5B in the first orientation after forming a planarized metal gate structure that wraps around the condensed channel region of the fins.
Figure 6B:
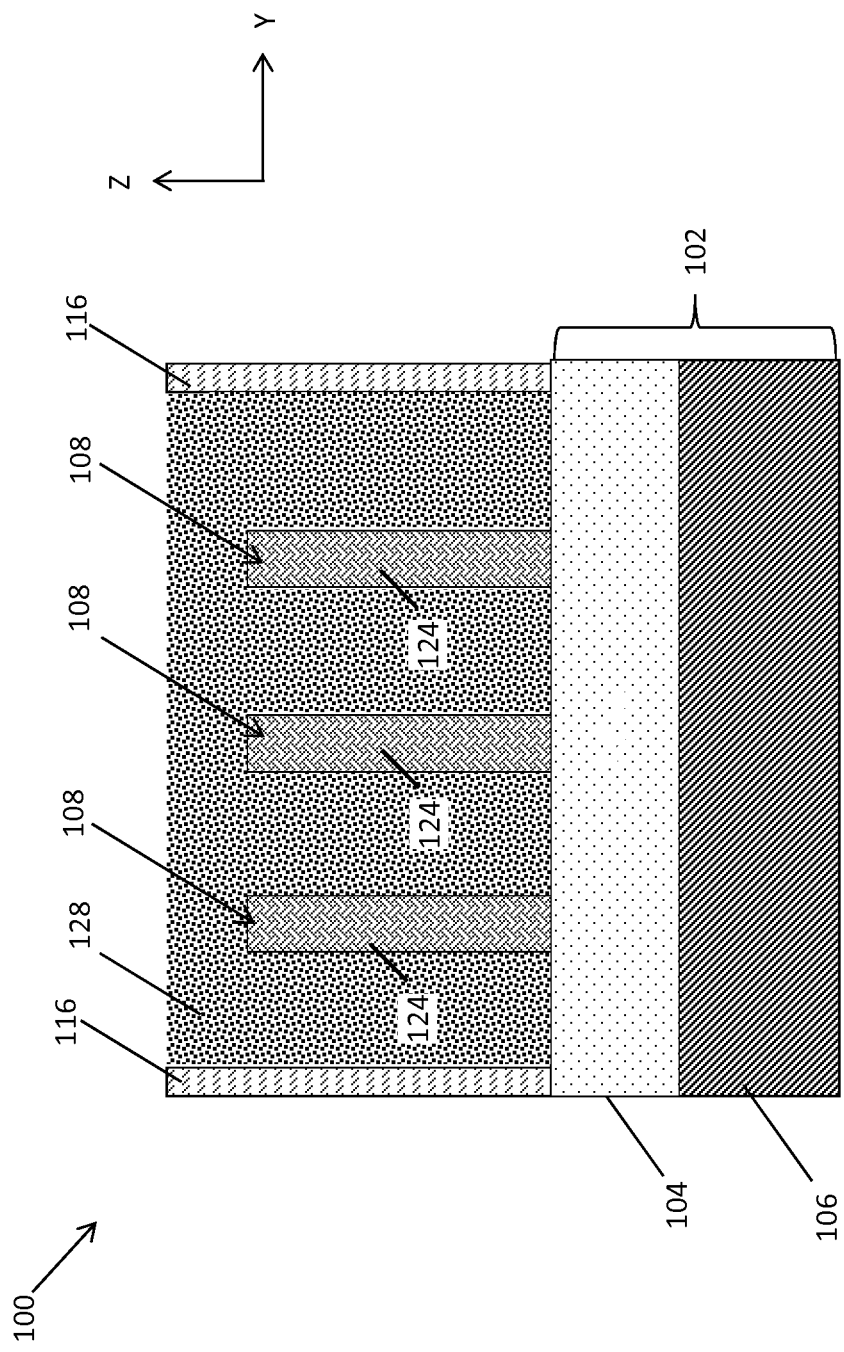
FIG. 6B illustrates the semiconductor device of FIG. 6A in the second orientation.

Turning now to FIGS. 6A-6B, the semiconductor device 100 is illustrated after depositing a metal gate structure 128 between the gate spacers 116 and atop the buried insulator layer 104. The metal gate structure 128 wraps around the sidewalls and the upper surface of the condensed channel region 124 so as to serve as a gate electrode as understood by one of ordinary skill in the art. The metal gate structure 128 can be formed of various metal gate materials including, but not limited to, tungsten (W).

Although not illustrated, it should be appreciated that the metal gate structure 128 may include one or more work function metal layers including, but not limited to, a titanium nitride (TiN) liner and a tantalum nitride (TaN) liner, formed on sidewalls of the metal gate structure 128 as understood by one of ordinary skill in the art. As mentioned earlier, a gate dielectric layer (e.g., a high-k gate dielectric layer) may be disposed atop the buried insulator layer 104. In this case, it should be appreciated that the metal gate structure 128 includes the metal gate material, the gate dielectric layer, and the work function metals. It should also be appreciated that a chemical-mechanical planarization (CMP) process may be performed after depositing the metal gate structure 128. In this manner, the upper surface of the metal gate structure 128 is formed flush with the upper surface of the gate sidewalls 106 as further illustrated in FIGS. 6A-6B.

Accordingly, at least one embodiment described above provides a finFET device including one or more semiconductor fins having a SiGe condensed channel region. In this manner, hole mobility through the channel region of the fins is improved compared to conventional finFET devices. For example, the hole mobility through the channel region may be approximately 3 times higher compared to conventional semiconductor fins having channel regions formed solely of silicon, e.g., Si<100> or Si<110>. In this manner, a finFET device according to at least one embodiment of the invention provides a finFET device having improved overall device performance compared to conventional finFET devices.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A method of fabricating a finFET device, the method comprising:
   forming, on an upper surface of a semiconductor substrate, at least one semiconductor fin comprising a first semiconductor material, the at least one semiconductor fin having a channel region interposed between opposing source/drain regions;
   forming first and second opposing gate spacers that wrap around the exterior surface of the at least one fin and define a gate region that extends between the first and second gate spacers to define a total gate region length;

forming a flowable insulator layer on the source/drain regions, and forming a dummy gate stack on the channel region;

selectively removing the dummy gate stack with respect to the flowable insulator layer to expose the channel region;

forming a condenser layer including a donor material directly on an upper surface and sidewalls of the exposed channel region;

performing a condensation process to selectively transform the entire exposed channel region into a second semiconductor material different from the first semiconductor material so as to form a condensed channel region configured to increase carrier mobility conductivity of the channel region, while maintaining the first semiconductor material of the source/drain regions, wherein the condensed channel region is comprised entirely of the second semiconductor material, and wherein the second semiconductor material has a total condensed channel length extending continuously across an entire upper surface of the channel region from an inner side of the first gate spacer to an inner side of the second gate spacer that matches the gate region length, and wherein the second semiconductor material directly contacts the first and second gate spacers, and wherein the source/drain regions excludes the donor material that is condensed to form the condensed channel region.

2. The method of claim 1, wherein the condensation process comprises:

condensing the exposed channel region in response to driving the donor material from the condenser layer into the exposed channel region to convert the first semiconductor material into the second semiconductor material while converting the condenser layer into an oxidized layer comprising an insulator material.

3. The method of claim 2, wherein forming the condenser layer includes epitaxially growing the condenser layer from the external surface of the exposed channel region.

4. The method of claim 2, wherein the first semiconductor material is silicon (Si).

5. The method of claim 4, wherein the condenser layer comprises a donee material that is maintained in the condenser layer during the condensation process.

6. The method of claim 5, wherein the first semiconductor material of the channel region is silicon (Si) and the donor material is germanium such that the second semiconductor material resulting from the condensation process is silicon germanium (SiGe).

7. The method of claim 6, wherein condensing the exposed channel region includes exposing the channel region to oxygen ($O_2$) ions that chemically interact with the donee material so as to convert the condenser layer comprising SiGe into the condensed insulator layer comprising $SiO_2$.

8. The method of claim 2, further comprising performing a selective etching process that attacks the insulator material with respect to the second semiconductor material so as to remove the condensed insulator layer from the condensed channel region.

9. The method of claim 8, further comprising forming a metal gate structure on the semiconductor substrate, the metal gate structure wrapping around all exposed sides of the condensed channel region.

10. The method of claim 9, wherein the substrate includes a semiconductor-on-insulator (SOI) substrate.

11. The method of claim 10, wherein the condenser layer is excluded from a buried insulator layer of the SOI substrate such the exposed channel area is condensed with respect to the buried insulator layer.

12. The method of claim 11, wherein the condensed channel region is formed directly on the buried insulator layer.

13. The method of claim 1, further comprising forming, between the first and second spacers, an electrically conductive gate structure having a gate length, wherein the condensed channel length of the second semiconductor material is equal to the gate length.

14. The method of claim 13, wherein the condensation process forms the second material that extends continuously from a first edge to a second edge, and wherein the first edge of the second material is formed directly against the first gate spacer and the second edge of the second material opposite the first edge is formed directly against the second gate spacer.

15. A method of fabricating a finFET device, the method comprising:

forming, on an upper surface of a semiconductor-on-insulator (SOI) substrate, at least one semiconductor fin comprising a first semiconductor material, the at least one semiconductor fin having a channel region interposed between opposing source/drain regions;

forming first and second opposing gate spacers that wrap around the exterior surface of the at least one fin and define a gate region that extends between the first and second gate spacers to define a total gate region length;

forming a flowable insulator layer on the source/drain regions, and forming a dummy gate stack on the channel region;

selectively removing the dummy gate stack with respect to the flowable insulator layer to expose the channel region; and performing a condensation process to selectively transform the entire exposed channel region into a second semiconductor material different from the first semiconductor material so as to form a condensed channel region configured to increase carrier mobility conductivity of the channel region, while maintaining the first semiconductor material of the source/drain regions, the condensation process further comprising:

forming a condenser layer including a donor material on an external surface of the exposed channel region; and condensing the exposed channel region in response to drive the donor material from the condenser layer into the exposed channel region to convert the first semiconductor material into the second semiconductor material while converting the condenser layer into an oxidized layer comprising an insulator material, wherein the condenser layer is excluded from a buried insulator layer of the SOI substrate such the exposed channel area is entirely condensed with respect to the buried insulator layer, and wherein the condensed channel region is comprised entirely of the second semiconductor material, and wherein the second semiconductor material has a condensed channel length extending continuously across an entire upper surface of the channel region from an inner side of the first gate spacer to an inner side of the second gate spacer that matches the gate region length, and wherein the second semiconductor material directly contacts the first and second gate spacers, and wherein the source/drain regions excludes the donor material that is condensed to form the condensed channel region.

16. The method of claim 15, further comprising forming, between the first and second spacers, an electrically conductive gate structure having a gate length, wherein the condensed channel length of the second semiconductor material is equal to the gate length.

* * * * *